United States Patent [19]

Ash

[11] Patent Number: 4,760,352
[45] Date of Patent: Jul. 26, 1988

[54] COUPLED RESONATOR PHASE SHIFT OSCILLATOR

[75] Inventor: Darrell L. Ash, Sachse, Tex.

[73] Assignee: R.F. Monolithics, Dallas, Tex.

[21] Appl. No.: 93,292

[22] Filed: Sep. 4, 1987

[51] Int. Cl.⁴ .............................................. H03B 5/24
[52] U.S. Cl. ............................... 331/107 A; 331/108 B
[58] Field of Search ......... 331/107 SL, 107 A, 108 B, 331/108 C; 333/150, 151, 152, 153, 154, 155, 193, 194, 195, 196, 219, 240, 247

[56] References Cited

U.S. PATENT DOCUMENTS

| | | | |
|---|---|---|---|
| 3,868,595 | 2/1975 | Capps, Jr. et al. | 331/108 A |
| 3,950,713 | 4/1976 | Lewis | 333/30 R |
| 3,970,970 | 7/1976 | Worley | 333/72 |
| 4,354,166 | 10/1982 | Grudkowski | 331/107 A |

OTHER PUBLICATIONS

Larry A. Coldren and Robert L. Rosenberg, "Acoustically Coupled Saw Resonator Filters with Enhanced Out-Of-Band Rejection" Nov. 1979, pp. 394-403, *IEEE Xactions on Sonics and Ultrasonics*, vol. SU-26, No. 6.

Primary Examiner—Eugene R. LaRoche
Assistant Examiner—David Mis
Attorney, Agent, or Firm—Alfred-E. Hall

[57] ABSTRACT

A phase shift oscillator formed with a surface acoustic wave coupled resonator in series with an amplifier and wherein the coupled resonator has a substantially 180° phase shift occurring between the 3dB points of the frequency response curve of the coupled resonator.

11 Claims, 2 Drawing Sheets

COUPLED RESONATOR PHASE SHIFT OSCILLATOR

BACKGROUND OF THE INVENTION

The present invention relates to a phase shift oscillator and in particular to a phase shift oscillator formed with a surface acoustic wave coupled resonator having at least a 180° phase shift occurring between the 3 dB points of the frequency response curve of the resonator. In particular the invention relates to a surface acoustic wave coupled resonator phase shift oscillator which oscillates at any desired frequency, either VHF or UHF, does not require inductors or capacitors, is relatively inexpensive, is shock insensitive and is temperature sensitive only as determined by the surface acoustic wave resonator.

Oscillators formed from surface acoustic wave devices are well-known in the art such as those disclosed in U.S. Pat. No. 3,868,595 and 3,950,713. These surface acoustic wave oscillators are formed from surface wave delay line devices used as the feed back network in the oscillator circuit. The surface acoustic wave delay line oscillator disclosed in U.S. Pat. No. 3,950,713 is for operation at relatively low frequencies since at high frequencies reflection problems become so pronounced that alternative techniques must be used. U.S. Pat. No. 3,868,595 also discloses a surface wave delay line oscillator operating at UHF frequencies. However, in order to provide stable oscillations, the input and output of the amplifier must be coupled to the output and input of the surface acoustic wave device through matching and/or phase shifting networks including inductors, capacitors and resistors.

The trend in the technology, of course, is to make the devices much less expensive, very small and compact. Such devices can be used in applications such as garage door opener transmitters, security devices, local oscillators and the like. In addition, military applications for stable oscillators are numerous. Military oscillators must be shock insensitive and temperature insensitive. Oscillators such as that disclosed in U.S. Pat. No. 3,950,713 are relatively shock insensitive and temperature insensitive but cannot operate at high frequencies. The surface acoustic wave oscillator disclosed in U.S. Pat. No. 3,868,595 can be used at high frequencies but is shock sensitive as well as temperature sensitive since the coils and capacitors vary the phase shift and the resultant frequency and the vibration of these devices or their change in physical shape because of temperature change respectively causes phase noise and changes the frequency of the oscillator.

The present invention overcomes the difficulties of the prior art by allowing the construction of a surface acoustic wave oscillator using coupled resonators having a 180° phase shift occurring between the 3 dB points of the frequency response curve thus allowing the oscillator to operate at any design frequency without the use of inductors or capacitors and which is shock insensitive and temperature insensitive.

SAW coupled resonators are well-known in the art such as that disclosed in U.S. Pat. No. 3,970,970. A coupled resonator consists of two SAW resonators acoustically coupled to one another and yielding a to pole narrow band pass response. In addition, between the 3 dB points of the frequency response curve a phase shift of 180° occurs. Thus with a phase shift of 180° at the center frequency the phase shift can vary from 90° at the lower 3 dB point to 270° at the higher 3 dB point. Simply by reversing the bonding or changing the signal connection to the input pads of the SAW device, the phase shift at the center frequency is shifted to 0° and thus covers the range from 270° to 90°. Thus the entire 360° spectrum is covered with the coupled resonator oscillator.

Therefore, it is an object of the present invention to provide a phase shift oscillator having an amplifier with an input and an output and a surface acoustic wave device having an input and an output, a frequency response passing through 3 dB points and at least a 180° phase shift occurring between the 3 dB points of the frequency response curve and means for connecting the output of the amplifier to the input of the SAW device and the input of the amplifier to the output of the SAW device to form an inductorless phase shift oscillator.

It is also an object of the present invention to provide a phase shift oscillator which utilizes a coupled resonator as the surface acoustic wave device coupled to an amplifier and having at least a 180° phase shift occurring between the 3 dB points of the frequency response curve of the coupled resonator.

It is still another object of the present invention to provide a phase shift oscillator having a transistor as an amplifier which is coupled to a surface acoustic wave device formed as a coupled resonator and having at least a 180° phase shift occurring between the 3 dB points of its frequency response curve.

It is yet another object of the present invention to provide a phase shift oscillator which utilizes a coupled resonator formed with a single phase unidirectional transducer and having at least a 180° phase shift occurring between the 3 dB points of its frequency response curve.

It is also an object of the present invention to provide a phase shift oscillator which utilizes a surface acoustic wave resonator structure having a piezoelectric substrate, first and second spaced gratings of $\lambda/4$ electrodes attached to the substrate, input and output spaced transducer structures having $\lambda/4$ electrodes and attached to the substrate between the first and second gratings for generating standing waves in the substrate and a resonant cavity formed on the substrate between one of the gratings and one of the transducers.

SUMMARY OF THE INVENTION

Thus the present invention relates to a phase shift oscillator comprising an amplifier having an input and an output, a surface acoustic wave device having an input and an output and having a frequency response curve passing through 3 dB points and at least a 180° phase shift occurring between the 3 dB points of said frequency response curve, and means for connecting the output of the amplifier to the input of the surface acoustic wave device and the input of the amplifier to the output of the surface acoustic wave device to form an inductorless phase shift oscillator.

The invention also relates to a method of forming a phase shift oscillator comprising the steps of forming an amplifier having an input and an output, forming a surface acoustic wave device having an input and an output and having a frequency response curve passing through 3 dB points, and at least a 180° phase shift occurring between the 3 dB points, and connecting the output of the amplifier to the input of the surface acoustic wave device and the input of the amplifier to the output of the surface acoustic wave device thereby forming an inductorless phase shift oscillator.

BRIEF DESCRIPTION OF THE DRAWINGS

These and other objects of the present invention will be disclosed more fully in conjunction with the accompanying drawings in which.

DETAILED DESCRIPTION OF THE DRAWINGS

Figure 1:
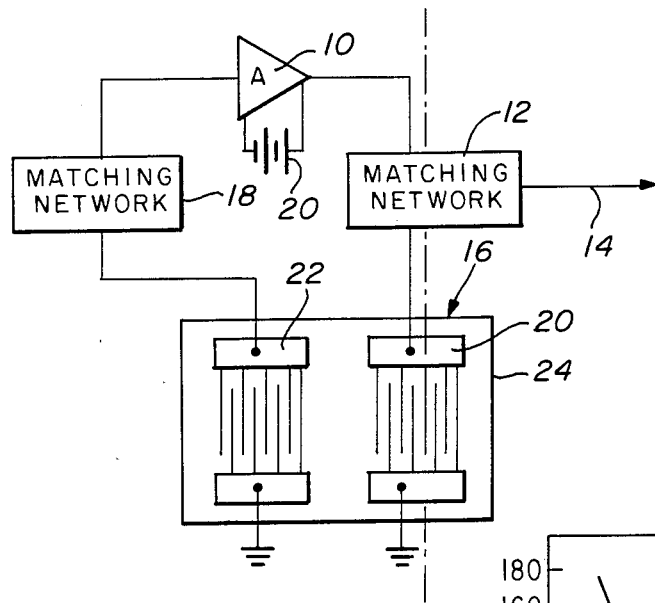
FIG 1 is a schematic diagram of a prior art phase shift oscillator using a surface acoustic wave delay line as a portion of the phase shift network including matching networks on both the input and the output of the amplifier and the surface acoustic delay line device for matching the amplifier impedance into the input and output of the surface acoustic wave delay line and providing the additional phase shift needed for oscillation.

FIG. 1 is a block diagram of an existing prior art phase shift oscillator utilizing a surface acoustic wave delay line as the phase shift element. Amplifier 10 has an output which is coupled to an impedance matching network 12. The oscillator output is on line 14. The output is also coupled through matching network 12 to surface acoustic wave delay line 16. The delay line 16 is formed on a quartz substrate 24 and includes input and output interdigitated transducers 20 and 22 respectively. The signal generated by output transducer 22 is coupled to an impedance matching network 18 whose output is coupled as the input to amplifier 10. The matching networks 12 and 18 are formed with inductors, capacitors and resistors. A power source 20 provides the power to drive amplifier 10. Amplifier 10 is designed to have sufficient gain to overcome the losses in the feedback circuit and provide an output on line 14.

Figure 2:
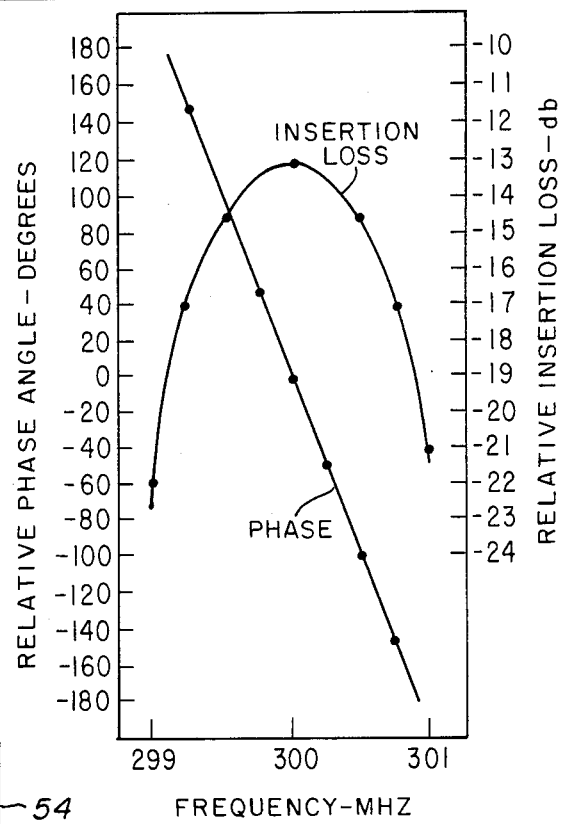
FIG. 2 is a graph of the phase and insertion loss versus frequency of the prior art device shown in FIG. 1.

Not only do the matching networks 12 and 18 provide for maximum power transfer between the amplifier 10 and the delay line 16 but they also fix the phase shift around the loop so that it is exactly 0° or some multiple of 360° so the device will oscillate. The amplitude and phase response of the matched delay line are shown in FIG. 2 and it can be seen therein that the phase response is linear through the pass band and that there is a 360° phase shift through the 6 dB points.

There are several problems with this type of circuit. First, it is relatively expensive but because it includes the inductors, capacitors and resistors. Secondly, its size is increased because of the use of the inductors, capacitors and resistors. In addition, it is shock sensitive because vibrations cause the coils or capacitors, which are frequency determining elements, to vibrate and thus cause a slight change in inductance or capacitance which causes a slight change in the phase and frequency. That shows up in the site bands causing phase noise. Further, coils and capacitors are temperature sensitive and change values with the change in temperature thus again causing a shift in frequency with temperature. It would be desirable therefore to have a phase shift oscillator utilizing a surface acoustic wave device without coils and capacitors because the device would then be entirely dependent upon the SAW device temperature characteristics and also would be shock insensitive, smaller in size and more economical to construct.

Figure 3:
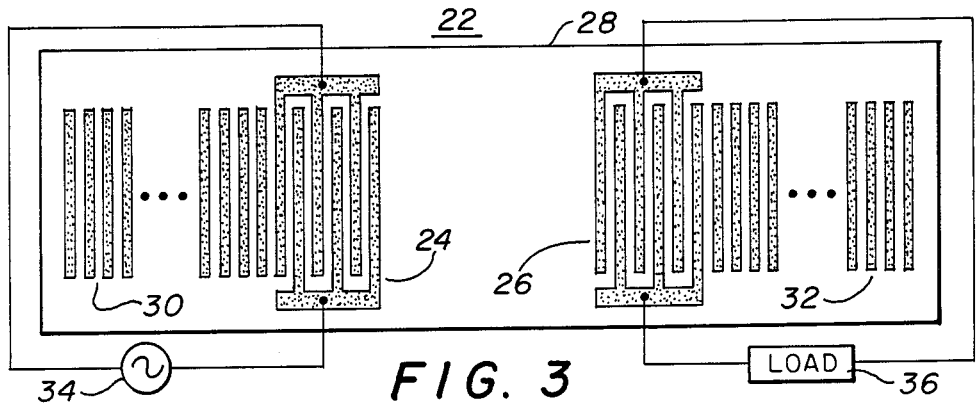
FIG. 3 is a schematic diagram of a prior art surface acoustic wave resonator structure.

Surface acoustic wave resonators are well-known in the art and such a device is illustrated in FIG. 3. The device 22 includes input transducer 24 and output transducer 26 as well as reflective gratings 30 and 32. The input signals are supplied from the generator 34 to the input transducer 24 and the load 36 is coupled to the output transducer 26.

Figure 4:
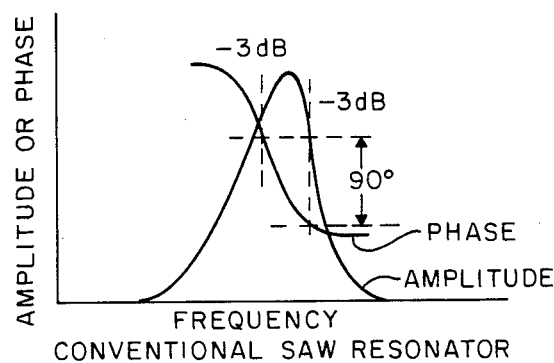
FIG. 4 is a frequency response curve of the conventional SAW resonator device illustrated in FIG. 3.

The amplitude or phase response of the device in FIG. 3 with respect to frequency is illustrated in FIG. 4. It will be noted that there is a 90° phase shift between the 3 dB points of the amplitude curve. While it is true that the phase shift is greater than 90° beyond the 3 dB points, the amplitude is decreasing so rapidly that the amplifier has a difficult time finding enough excess gain to oscillate. The real frequencies of interest are between the 3 dB points and as shown in FIG. 4, as in the case of a conventional resonator, the phase shift between those points is 90°. Thus the graph in FIG. 4 is the typical single pole narrow band pass response of the conventional SAW resonator. The phase of the resonator center frequency can be 0° or 180° depending upon the bonding pad connections. In other words, one of the bonding pads of the input transducer and output transducer would be grounded whereas the other one would have the signal on it. With one such connection the center frequency is 0° and when the connections are reversed so that the signal connection now becomes the ground connection and vice versa, the center frequency is 180°. In either case, the phase can shift only 45° from the center frequency on either side thus making a total of 90° phase shift. From 0° the signal can vary from 45° to 315°. At 180°, the signal can vary from 135° to 225°. As stated previously, in either case there is a phase discontinuity of 180° which would require the use of tuning coils and tuning capacitors to shift the phase into those regions. This of course would bring us back to the prior art type of phase shift oscillators which are shock sensitive and temperature sensitive as well as more expensive and require more space.

Figure 5:
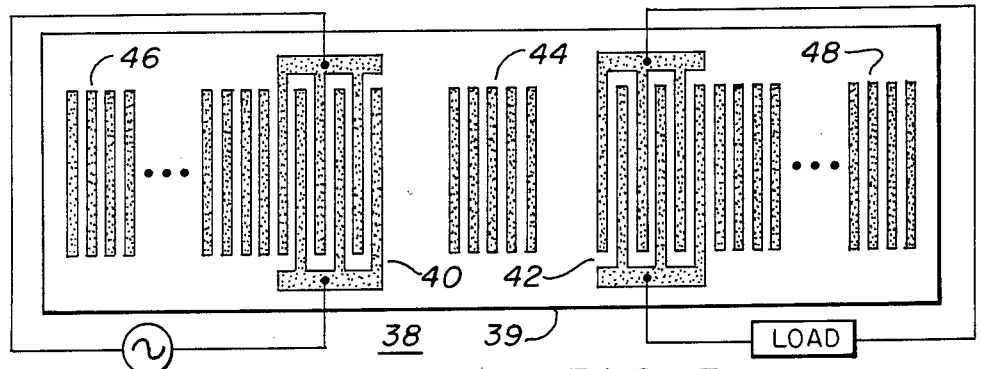
FIG. 5 is a schematic representation of a prior art coupled resonator surface acoustic wave device.
Figure 6:
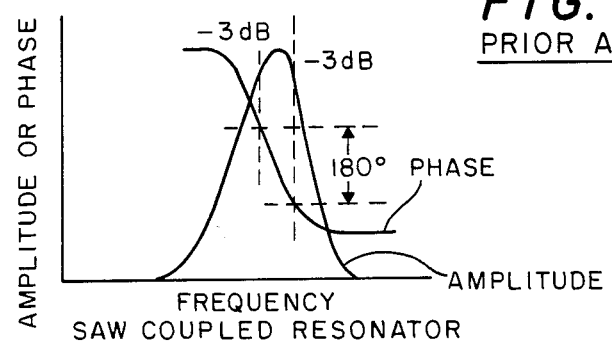
FIG. 6 is the frequency response curve of the prior art surface acoustic wave coupled resonator shown in FIG. 5.

The problem can be solved with the use of a coupled resonator which is well-known in the prior art. Such resonator is shown in FIG. 5. The coupled resonator 38 is formed on a piezo-electric crystal 39 and includes an input transducer 40 and an output transducer 42 separated by a resonant cavity 44 which is a-periodic with the transducers 40 and 42 and with reflective gratings 46 and 48. The device has two electrodes per wave length and thus an electrode width of λ/4. Such prior art resonator is disclosed in U.S. Pat. No. 3,970,970. The frequency and phase response curve of the prior art coupled resonator shown in FIG. 5 is illustrated in FIG. 6. Note that the SAW coupled resonator has a 180° phase shift between the 3 dB points instead of 90°. The reason of course, as is well-known in the art, is that the two resonators in a coupled resonator device are in effect in series. When the frequency of one of the transducers is offset slightly from the design frequency of the other, the overall frequency response is a two-pole band pass with twice the phase shift of a conventional resonator. Thus, maintaining the same band width will enable twice the phase shift per hertz. Thus as can be seen in FIG. 6 between the 3 dB points, there is a phase shift of 180° which will allow a phase shift oscillator to be constructed without the use of coils or capacitors. The phase of the coupled resonator center frequency can be either 0° or 180° so once again if the center frequency is at 0°, the frequency can vary from +90° to −90° (270°). In like manner, if the resonator center frequency is 180°, the frequency can vary from +90° to −90° (270°). Again, if the center frequency is at 0°, the band pass which is greater than 90° but less than 270° is omitted. In like manner, if the center frequency is at 180°, the band pass which is greater than 270° but less than 90° is missing. Again, once it is determined in which of the quadrants the circuit needs to operate, the bonding of the connections to the input and output pads can be reversed to cause the unit to operate with the center frequency of either 0° or 180°.

Figure 7:
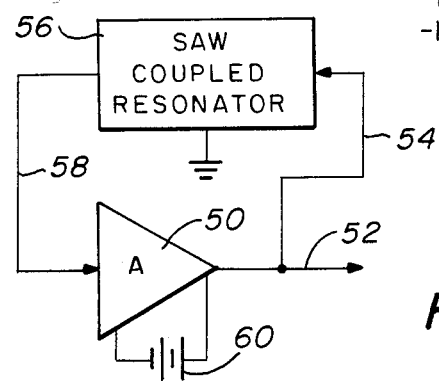
FIG. 7 is a schematic representation of the novel phase shift oscillator of the present invention which utilizes a SAW coupled resonator as the phase shift device.

Thus the coupled resonator circuit shown in FIG. 5 is ideal for use in the novel surface acoustic wave coupled resonator oscillator disclosed in FIG. 7. Before constructing the SAW coupled resonator, the amount of phase shift that will be contributed by the amplifier must be determined. For example, assume a transistor amplifier coupled in a common emitter configuration. Ideally the phase shift through this circuit or amplifier is 180°. But that is true only under ideal conditions. As the frequency applied to the amplifier begins to increase, there is an increasing delay between the time the signal is applied and the time that the output is produced. The delay produces an additional phase shift on top of the ideal 180° phase shift. As an example, if a transistor has a design frequency of 3 GHz and it is operated at 10 MHz the total phase shift may be very close to 180°. However, if it is operated at 300 MHz its phase shift is not now 180°. It may be more in the order of 230°. In other words there is an added 50° phase shift that has been contributed to the normal operation of the transistor simply because of the frequency at which it is operated.

Again, assume that the same transistor is operated in the common collector mode. Ideally the phase shift would be 0°. However, if again, it is run at a much higher frequency in the order of 300 MHz, the phase shift is now 50°. In the UHF range there is a considerable phase shift in the active devices such as transistors. There is not as much phase shift in the VHF range.

Consider the standard resonator shown in FIG. 3 and its attendant amplitude or phase response curve shown in FIG. 4 when used in the VHF range. Suppose for example in the UHF range utilizing a standard resonator, a 50° phase shift error occurs. Since the standard resonator has a 90° phase shift, (from 0° to +45° and −45°) the phase shift has exceeded the 3 dB band width of the standard resonator by 5°. In addition, the higher the frequency at which the device is used, the larger the phase shift error becomes. For example, at 1000 MHz, the phase shift may be 280°. Obviously, this is totally outside the capabilities of the standard resonator no matter which way it is bonded. The only way to use that type of a device is to add phase shifters with the use of coils and capacitors to make the device oscillate at the proper frequency.

However, utilizing the SAW coupled resonator shown in FIG. 5, having a 180° phase shift, the devices will not only work at VHF but also at UHF frequencies. Thus, in that case, ±90° (a total of 180°,) includes both the 50° phase shift and the 280° phase shift. Thus the present invention utilizes the entire phase continuum in which oscillations occur without the use of coils or capacitors simply by determining the initial phase shift of the amplifier and bonding the input and output connections to the coupled resonators to cause the device to oscillate in the proper region.

Thus in the novel circuit shown in FIG. 7 which utilizes a coupled resonator in conjunction with an amplifier to form a phase shift oscillator, it is noted that amplifier 50 produces an output on line 52 which is also coupled through line 54 to the input of the coupled resonator 56. The output of the coupled resonator 56 on line 58 is coupled as the input to amplifier 50. The device is powered by a power supply such as battery 60. By utilizing as the coupled resonator 56 the device shown in FIG. 5, and by knowing the phase shift through amplifier 50 for a given frequency, the coupled resonator can have its input and output leads bonded to the transducers so as to cause the resonator to have a phase shift in the particular region in which amplifier 50 operates. Thus, assume that the delay through amplifier 50 at high frequencies is 230°. SAW coupled resonator 56 can then be bonded to have a center frequency of 180° ±90° which will obviously cover the 230° phase shift of the amplifier 50 and thus allow the device to oscillate at the design frequency without the need for coils or capacitors to adjust the phase shift of the amplifier 50 to match that of the coupled resonator.

It is also obvious that NPN or PNP transistor amplifiers could be utilized as amplifier 50. In addition, the amplifier may be coupled in the common emitter configuration, common base or common collector configurations to obtain the advantages of any particular transistor configuration. In addition, an integrated circuit could be used as the amplifier 50.

The coupled resonator 56 may be of any well-known type but in particular may be well suited for constriction with use of a single phase unidirectional surface acoustic wave transducer and in particular of the type disclosed in commonly assigned co-pending U.S. Pat. application Ser. No. 677,513, entitled SINGLE PHASE UNIDIRECTIONAL SURFACE ACOUSTIC WAVE TRANSDUCER and filed Dec. 3, 1984 and which is incorporated herein by reference in its entirety. The maximum frequency operation may be obtained with such device inasmuch as it utilizes quarter wave length electrodes.

In like manner, the resonator structure disclosed in commonly assigned co-pending application Ser. No. 822,233, entitled, RESONATOR STRUCTURE and filed Jan. 24, 1986, and incorporated herein by reference in its entirety, may also be used for the same reason. The resonator structure disclosed therein comprises a piezoelectric substrate, first and second spaced gratings of $\lambda/4$ electrodes attached to the substrate, input and output spaced transducer structures having $\lambda/4$ electrodes and attached to the substrate between the first and second gratings for generating standing waves in the substrate, and the resonant cavity formed on the substrate between one of the gratings and one of the transducers.

Thus a phase shift oscillator has been disclosed which has no coils or capacitors, which operates from the VHF through the UHF ranges, is relatively inexpensive, is relatively small and compact, is shock insensitive and temperature insensitive. It is shock insensitive inasmuch as there are no coils or capacitors to vibrate thereby causing phase noise or jitter in the carrier. Further, it is well-known that depending upon the crystal cut used, surface acoustic wave devices are very temperature stable.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A coupled resonator phase shift oscillator comprising:
   a. an amplifier having an input and an output and a predetermined phase shift between said input and output,
   b. a surface acoustic wave coupled resonator having:
      i. an input and an output,
      ii. a frequency response curve passing through 3 dB points; and
      iii. a phase shift occurring between the 3 dB points which, when added to said amplifier phase shift, causes oscillation, and
   c. means for connecting the output of said amplifier as an input to said coupled resonator and the output of said coupled resonator as the input of said amplifier to form an inductorless phase shift oscillator.

2. An oscillator as in claim 1 wherein said amplifier is formed of a transistor or integrated circuit.

3. An oscillator as in claim 2 wherein said coupled resonator is formed with single phase unidirectional transducers.

4. An oscillator as in claim 2 wherein said coupled resonator is formed of resonator structures comprising;
   a. a piezo-electric substrate,
   b. first and second spaced gratings of λ/4 electrode attached to said substrate,
   c. input and output spaced transducer structures having λ/4 electrodes and which are attached to said substrate between said first and second gratings for generating standing waves in said substrate, and
   d. a resonant cavity formed on said substrate between one of said gratings and one of said transducers.

5. An oscillator as in claim 1 wherein said phase shift of said coupled resonator between said 3 dB points is substantially 180° or greater.

6. A method of forming a coupled resonator phase shift oscillator comprising the steps of:
   a. forming an amplifier having an input and an output and a predetermined phase shift between said input and output,
   b. forming a surface acoustic wave coupled resonator having
      i. an input and an output,
      ii. a frequency response curve passing through the 3 dB points, and
      iii. a phase shift occurring substantially between the 3 dB points and which, when added to said amplifier phase shift, causes oscillations, and
   c. connecting the output of said amplifier to the input of said coupled resonator and the output of said coupled resonator to the input of said amplifier so as to form an inductorless phase shift oscillator.

7. A method as in claim 6 further comprising the step of forming said amplifier with a transistor or integrated circuit.

8. A method as in claim 7 further comprising the step of forming said coupled resonator with single phase unidirectional transducers.

9. A method as in claim 7 wherein said coupled resonator is formed comprising the steps of:
   a. attaching first and second spaced gratings of λ/4 electrodes to a piezo-electric substrate,
   b. attaching input and output spaced transducers having λ/4 electrodes to said substrate between said first and second gratings for generating standing waves in said substrate,
   c. positioning a coupler grating on said substrate between said input and output transducers,
   d. forming a first resonant cavity on said substrate between said input transducer and said first grating, and
   e. forming a second resonant cavity on said substrate between said coupler grating and said output transducer.

10. A method as in claim 7 further comprising the step of designing said amplifier to operate at or above 225 MHz.

11. A method as in claim 7 wherein said phase shift of said coupled resonator between said 3 dB points is substantially 180° or greater.

* * * * *